United States Patent
Kim et al.

(10) Patent No.: US 10,503,080 B1
(45) Date of Patent: Dec. 10, 2019

(54) 3D MICRO LITHOGRAPHY-PRINTING SYSTEM USING TILTING AND ROTATIONAL UV-LED

(71) Applicants: SAMIL TECH CO., LTD., Bucheon-si (KR); KANSAS STATE UNIVERSITY RESEARCH FOUNDATION, Manhattan, KS (US)

(72) Inventors: Jong Eun Kim, Siheung-si (KR); Jungkwun Kim, Manhattan, KS (US)

(73) Assignees: SAMIL TECH CO., LTD., Gyeonggi-Do (KR); KANSAS STATE UNIVERSITY RESEARCH FOUNDATION, Manhattan, KS (US)

( * ) Notice: Subject to any disclaimer, the term of this patent is extended or adjusted under 35 U.S.C. 154(b) by 0 days.

(21) Appl. No.: 16/411,667

(22) Filed: May 14, 2019

(30) Foreign Application Priority Data

Apr. 10, 2019  (KR) .......................... 10-2019-0042115

(51) Int. Cl.
  *G03F 7/20*  (2006.01)
(52) U.S. Cl.
  CPC ................. *G03F 7/70716* (2013.01)
(58) Field of Classification Search
  CPC .. G03F 7/70391; G03F 7/7005; G03F 7/7035; G03F 7/708; G03F 7/70716
  See application file for complete search history.

(56) References Cited

U.S. PATENT DOCUMENTS 8,531,647 B2 *  9/2013  Kim ...................... G03F 7/7005
                                                         257/91
2004/0240813 A1 * 12/2004  Koyagi ............. B23K 26/0604
                                                         385/115

FOREIGN PATENT DOCUMENTS

| KR | 20110058501 | 6/2011 |
| KR | 20110074623 | 6/2011 |
| KR | 20130092224 | 8/2013 |
| KR | 20140058135 | 5/2014 |

OTHER PUBLICATIONS

CNC-Lithography: Computer-Controlled Multidirectional Light-Motion-Synchronized Lithography for 3-D Microfabrication, Jungkwun Kim et al., Transducers 2015, 1358-1361 Anchorage, Alaska, USA, Jun. 21-25, 2015 (Year: 2015).*

(Continued)

*Primary Examiner* — Steven Whitesell Gordon
(74) *Attorney, Agent, or Firm* — Cantor Colburn LLP

(57) ABSTRACT

Provided is a 3D micro lithography-printing system using tilting and rotational UV-LEDs, in which a lithography module provided with LED lens for irradiating ultraviolet light for lithography is provided rotatable or revolvable in a left and right horizontal direction, and a substrate stage with a lithography object mounted thereto is provided movable forward and backward, changeable in forward and backward angles, and horizontally rotatable left and right, and thus, by changing the irradiation direction of ultraviolet light in a three-dimensional manner, a high-aspect ratio pillar and a 3D structure can be formed. In addition, various types of 3D structure can also be formed through a multi-layer lithography to a lithography object, and micro-forming within a range of approximately 5 μm is also possible.

3 Claims, 15 Drawing Sheets

(56) References Cited

OTHER PUBLICATIONS

Computer numerical control (CNC) lithography: light-motion synchronized UV-LED lithography for 3D microfabrication, Jungkwun Kim et al., 2016, J. Micromech. Microeng. 26 035003 (Year: 2016).*

Double-side Exposure UV-LED CNC Lithography for Fine 3D Microfabrication, Jungkwun Kim et al., Proceedings of the 12th IEEE International Conference on Nano/Micro Engineered and Molecular Systems Apr. 9-12, 2017, Los Angeles, USA (Year: 2017).*

Computer-controlled dynamic mode multidirectional UV lithography for 3D microfabrication, Jungkwun Kim et al., 2011, J. Micromech. Microeng. 21 035003 (Year: 2011).*

* cited by examiner

3D MICRO LITHOGRAPHY-PRINTING SYSTEM USING TILTING AND ROTATIONAL UV-LED

BACKGROUND OF THE INVENTION

Field of the Invention

The present invention relates generally to a 3D micro lithography-printing system using tilting and rotational UV-LEDs, in which the lithography-printing system forms a pattern by irradiating ultraviolet light for lithography to a lithography object with a mask being laminated on a substrate. More particularly, the present invention relates to a 3D micro lithography-printing system using tilting and rotational UV-LEDs, in which a lithography module provided with LED lens for irradiating ultraviolet light for lithography is provided rotatable or revolvable in a left and right horizontal direction, and a substrate stage with a lithography object mounted thereto is provided movable forward and backward, changeable in forward and backward angles, and horizontally rotatable left and right, and thus, by changing the irradiation direction of ultraviolet light in a three-dimensional manner, a high-aspect ratio pillar and a 3D structure can be formed. In addition, various types of 3D structure can also be formed through a multi-layer lithography to a lithography object, and micro-forming within a range of approximately 5 µm is also possible.

Description of the Related Art

In general, a lithography apparatus is used in the technical field of a flat panel display and a printed circuit board.

Specifically, the lithography apparatus is used to form a plurality of identical or different patterns such as electrodes or dots on a glass substrate or a printed circuit board, or to form patterns constituting a circuit on a printed circuit board.

A lithography method using such a lithography apparatus generally includes: a step of applying or coating an ink such as a photoresist (PR) solution or a metal paste such as copper (Cu), silver (Ag), and aluminum (Al); a step of transmitting the light irradiated from a light source of the lithography apparatus through a pattern mask onto the coated ink; and etching and cleaning steps.

Lithography apparatuses for patterning printed circuit boards are disclosed in Korean Patent Application Publication No. 10-2011-0058501, Korean Patent Application Publication No. 10-2013-0092224, Korean Patent Application Publication No. 10-2014-0058135, Korean Patent Application Publication No. 10-2011-0074623, and the like.

A substrate stage on which a substrate and a mask are aligned and seated, and a lithography module for irradiating light beam for lithography are fixedly arranged on top of each other, thereby irradiating the light beam for lithography to the lithography object to form a pattern.

A conventional lithography apparatus is problematic in that since the irradiation angle or direction of the light beam and the direction of the substrate irradiated with the light beam are fixed up and down, it is impossible to form a multi-layer pattern, especially a micro-pattern in various shapes, so the type and number of printed circuit boards produced using the lithography apparatus are limited.

In other words, the printed circuit board lithography method according to the type of PR solution is different as follows.

In the developing step that proceeds after lithography, the portion irradiated with light is removed at the time of lithography, and the remaining portion except for the portion irradiated with the light is cured, thereby forming a pattern.

Alternatively, in the development step that proceeds after lithography, a portion irradiated with light is cured at the time of lithography, and the remaining portion except for the portion irradiated with the light is removed, thereby forming a pattern.

Here, since the direction in which the light beam is irradiated and the direction of the substrate irradiated with the light beam are formed only in a direction perpendicular to the plane of the substrate, it is not suitable for forming a micro-pattern and a multi-layer pattern, and thus, the shape of the pillar forming the multi-layer pattern and the 3D pattern cannot be embodied in various forms in a three-dimensional manner, which limits the use of the lithography apparatus.

The foregoing is intended merely to aid in the understanding of the background of the present invention, and is not intended to mean that the present invention falls within the purview of the related art that is already known to those skilled in the art.

Documents of Related Art (Patent document 1) Korean Patent Application Publication No. 10-2011-0058501, (Patent document 2) Korean Patent Application Publication No. 10-2013-0092224, (Patent document 3) Korean Patent Application Publication No. 10-2014-0058135, and (Patent document 4) Korean Patent Application Publication No. 10-2011-0074623.

SUMMARY OF THE INVENTION

Accordingly, the present invention has been made keeping in mind the above problems occurring in the conventional retractor for endoscopic surgery, and an object of the present invention is to provide a 3D micro lithography-printing system using tilting and rotational UV-LEDs, in which a lithography module provided with LED lens for irradiating ultraviolet light for lithography is provided rotatable or revolvable in a left and right horizontal direction, and a substrate stage with a lithography object mounted thereto is provided movable forward and backward, changeable in forward and backward angle, and horizontally rotatable left and right, and thus, by changing the irradiation direction of ultraviolet light in a three-dimensional manner, a high-aspect ratio pillar and a 3D structure can be formed, and a multi-layer lithography can be performed by applying the mask alignment function (mask aligner).

In order to achieve the above object, according to some aspect of the present invention, there is provided a 3D micro lithography-printing system using tilting and rotational UV-LEDs, in which the lithography-printing system forms a pattern by irradiating ultraviolet light for lithography to a lithography object with a mask being laminated on a substrate, the lithography-printing system including: a main body including: a table; and a guide frame provided in a left and right horizontal direction at an upper portion of the table; a tilting stage including: a pair of first movable frames provided movable forward and backward on the table; a tilting frame connecting upper ends of the pair of first movable frames together, and being configured to be rotated forward and backward to change an angle; a rotatable plate provided horizontally rotatable left and right on an upper surface of the tilting frame; and a seating block provided on an upper surface of the rotatable plate, with the lithography object fixed to the seating block; and a lithography unit including: a second movable frame provided movable in the left and right horizontal direction along the guide frame; and a lithography module configured to be horizontally rotated left and right about a central axis or horizontally revolved left and right about an imaginary axis at a front surface of the second movable frame, and provided with a plurality of UV LED lamps for lithography on a lower surface thereof for forming a pattern.

The 3D micro lithography-printing system using tilting and rotational UV-LEDs according to the present invention may further include an alignment unit that includes: a third movable frame connected to a side of the second movable frame to be moved along the guide frame in the left and right horizontal direction along with the second movable frame; and a microscope coupled to a front surface of the third movable frame, and used to visually check whether the mask laminated on the substrate is aligned.

The 3D micro lithography-printing system using tilting and rotational UV-LEDs according to the present invention may further include a mask loading unit that includes: a movable plate provided movable forward and backward under the tilting frame; a first movable block provided positionally adjustable left and right with respect to the movable plate; a second movable block provided positionally adjustable forward and backward with respect to the first movable block; a vertically movable block provided adjustable in height with respect to the second movable block; and a loading frame extending from the vertically movable block to a position above the rotatable plate by bypassing the rotatable plate and having a detachable portion allowing the mask to be seated thereon.

The 3D micro lithography-printing system using tilting and rotational UV-LEDs according to the present invention may further include a control means that individually controls the plurality of UV LED lamps for lithography to enable individual control for each of the lamps by combining at least one of light-on or light-off of each lamp, color of each lamp, and brightness of each lamp.

The 3D micro lithography-printing system using tilting and rotational UV-LEDs according to the present invention has the following advantages.

First, by changing the irradiation direction of light and the incident direction of the light in a three-dimensional manner, a 3D structure can be formed, or a pillar forming a multilayer circuit pattern can be three-dimensionally formed in a various shapes while having a high-aspect ratio through multilayer lithography can be performed through the mask alignment function (mask aligner).

Second, it is possible to form a micro-pillar within a range of 30 to 50 µm, more particularly, a range of approximately 5 µm through 3D forming, which cannot be realized by the conventional lithography apparatus.

Third, it is possible to increase alignment accuracy between the substrate and the mask, it is possible to reduce the defect rate by finely adjusting the forward, backward, left, and right positions and height of the mask to precisely align the substrate and the mask, and the multi-layer forming of the pillar is possible by replacing the mask using one lithography apparatus.

Fourth, it is possible to improve the quality and productivity of the printed circuit board by uniformly forming the pillar of the micro-pattern in various shapes.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Figure 1A:
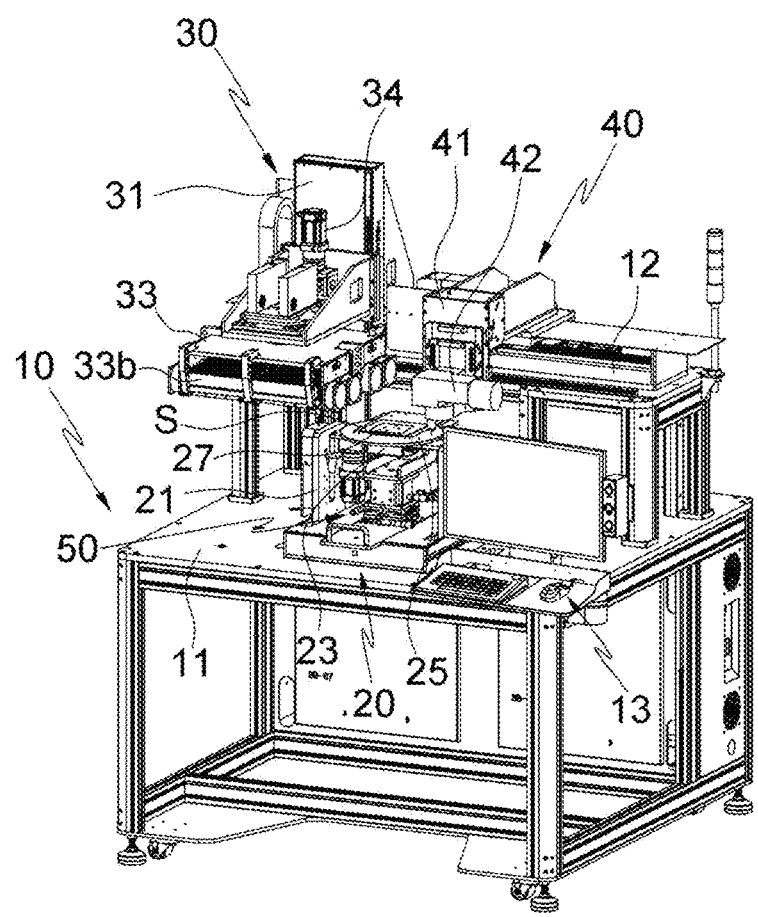
FIGS. 1A and 1B are perspective views showing the present invention.
Figure 1B:
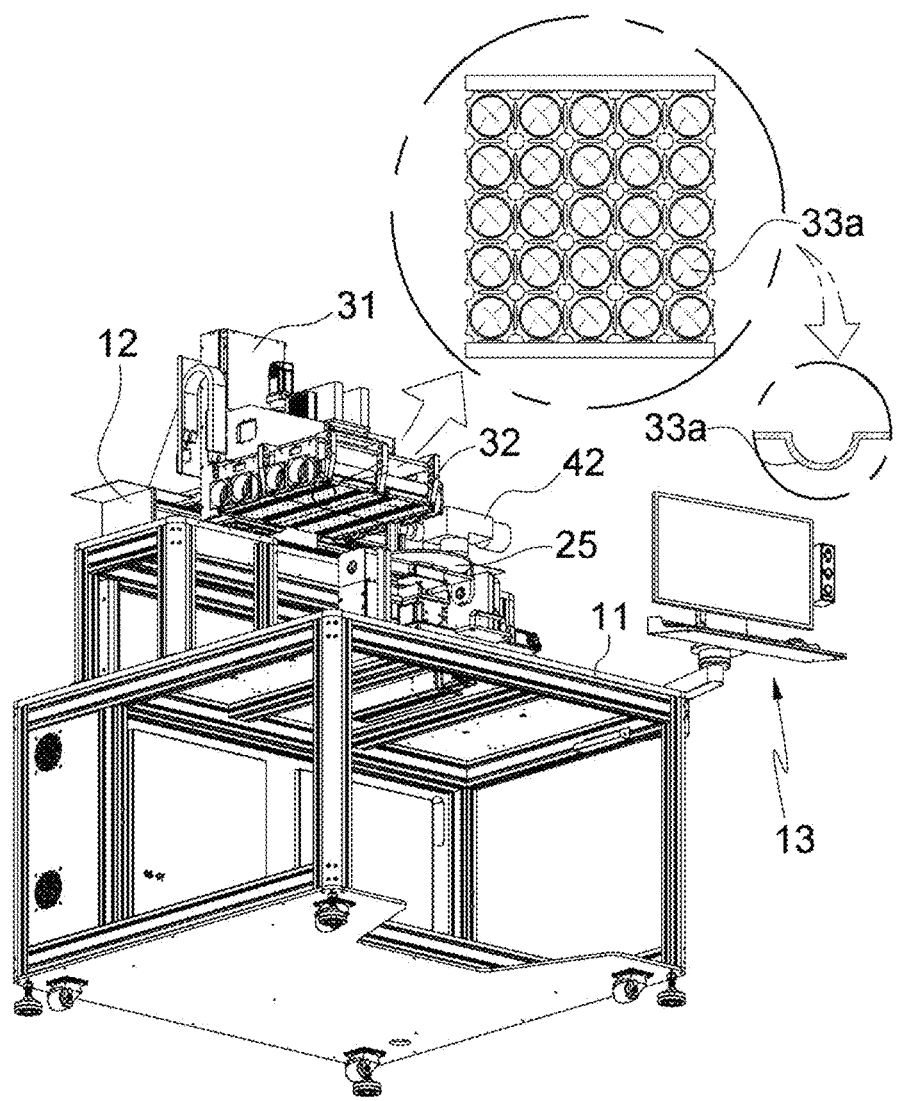
Figure 2:
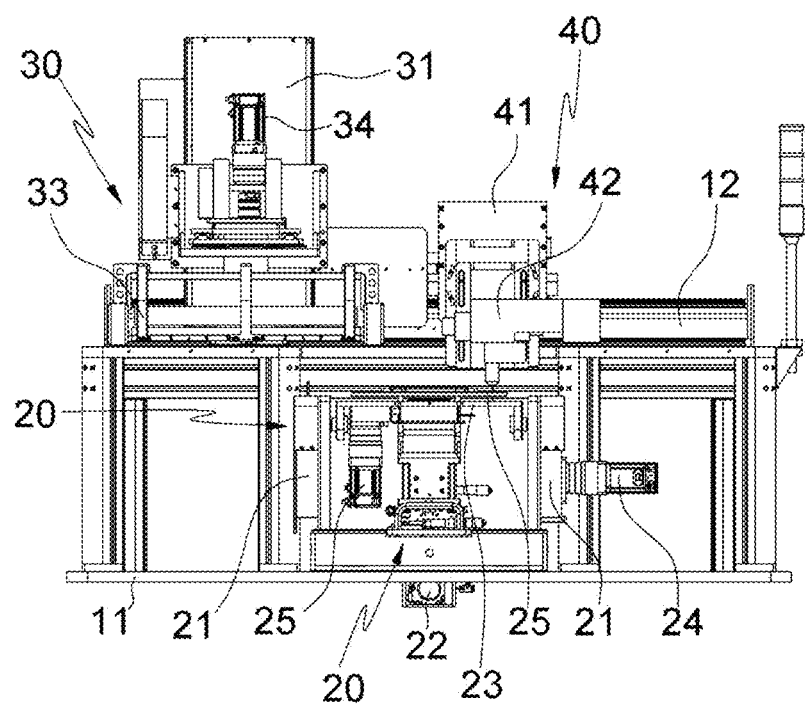
FIG. 2 is a front view of an important portion of the present invention.
Figure 3A:
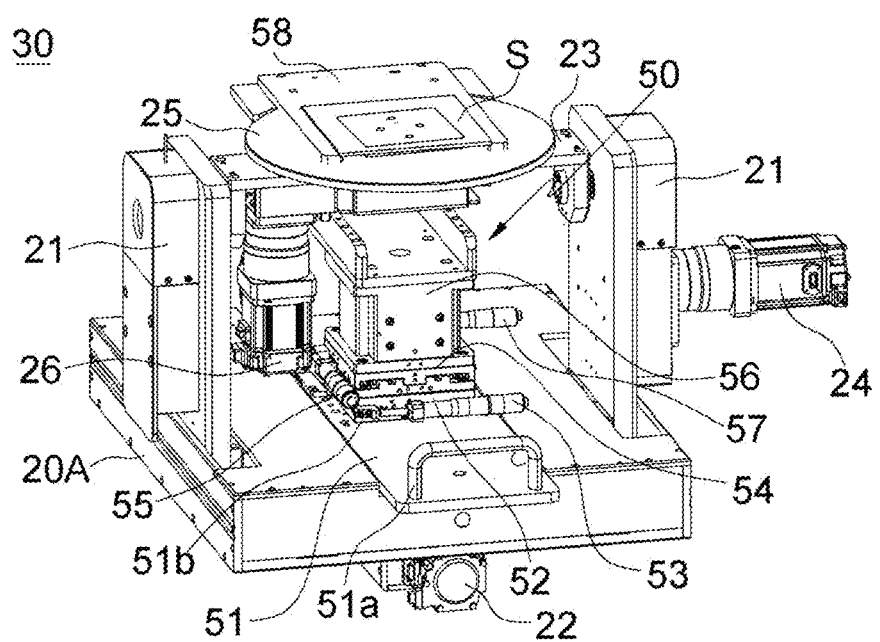
FIGS. 3A and 3B are perspective views showing a tilting stage and a mask loading unit according to the present invention.
Figure 3B:
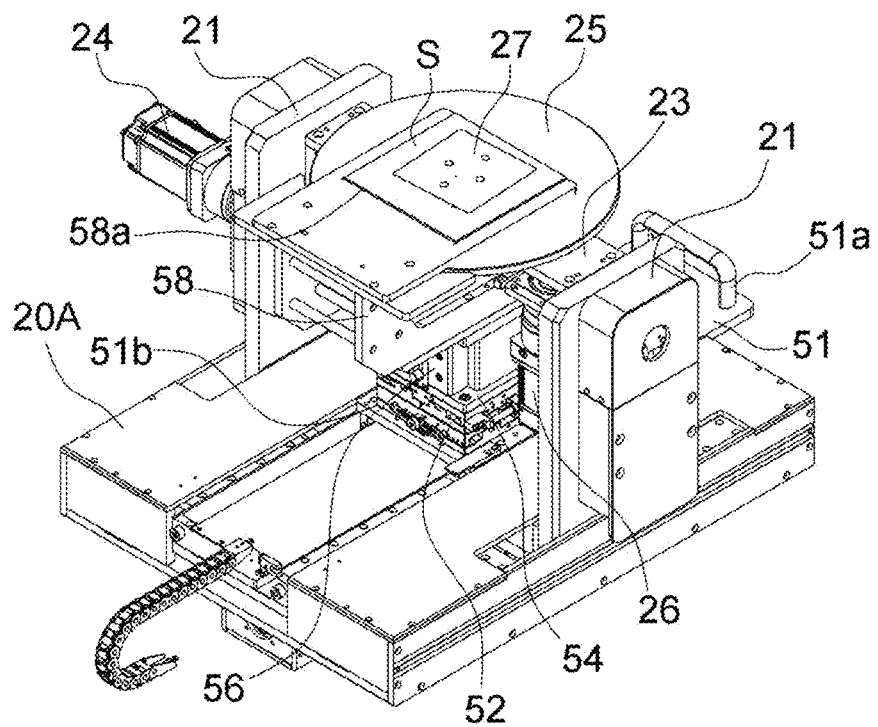

Hereinbelow, the present invention will be described in detail based on aspects (or embodiments). The present invention may, however, be embodied in many different forms and should not be construed as being limited to only the embodiments set forth herein, but should be construed as covering modifications, equivalents or alternatives falling within ideas and technical scopes of the present invention.

In the figures, like reference numerals, particularly, tens and units, or reference numerals having like tens, units and letters refer to like elements having like functions throughout, and unless the context clearly indicates otherwise, elements referred to by reference numerals of the drawings should be understood on the basis of this standard.

Also, for convenience of understanding the elements, in the figures, sizes or thicknesses may be exaggerated to be large (or thick), may be expressed to be small (or thin), or may be simplified for clarity of illustration, but due to this, the protective scope of the present invention should not be interpreted narrowly.

The terminology used herein is for the purpose of describing particular aspects (or embodiments) only and is not intended to be limiting of the present invention. As used herein, the singular forms are intended to include the plural forms as well, unless the context clearly indicates otherwise.

It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element, from another element. For instance, a first element discussed below could be termed a second element without departing from the teachings of the present invention. Similarly, the second element could also be termed the first element.

For the sake of convenience in describing a 3D micro lithography-printing system using tilting and rotational UV-LEDs according to the present invention, an approximate direction reference may be defined as follows with reference to FIG. 1A: a direction in which a tilting stage 20 is disposed is designated as the front; a direction in which the gravity acts is designated as the downward direction based on a direction facing the front; and directions of up, down, left, and right are designated viewed as they are. Unless otherwise specified in the description and claims of the invention relating to other drawings, directions are specified in accordance with this reference.

Further, in this specification, the left and right horizontal direction of a guide frame 12 is defined as an X-axis, the horizontal forward and backward direction horizontally perpendicular to the guide frame 12 is defined as a Y-axis, and the up and down vertical direction is defined as a Z-axis.

Hereinbelow, a 3D micro lithography-printing system using tilting and rotational UV-LEDs according to the present invention will be described in detail with reference to the accompanying drawings.

The present invention relates to a 3D micro lithography-printing system using tilting and rotational UV-LEDs, in which the lithography-printing system forms a pattern by irradiating ultraviolet light for lithography to a lithography object S with a mask M being laminated on a substrate B, and as shown in FIGS. 1A to 5E, the lithography-printing system roughly includes a main body 10, a tilting stage 20, a lithography unit 30, an alignment unit 40, a mask loading unit 50, and a control means.

The main body 10 includes: a table 11; and a guide frame 12 provided in a left and right horizontal direction at an upper portion of the table 11.

The tilting stage 20 and the mask loading unit 50 are provided at the center front end of the table 11, and the guide frame 12 is provided at the rear end of the table 11 in the left and right horizontal direction, wherein second and third movable frames 31 and 41 are slidably coupled to the guide frame 12 to allow the lithography unit 30 and the alignment unit 40 to be moved left and right.

The tilting stage 20 includes: a pair of first movable frames 21 provided movable forward and backward on the table 11; a tilting frame 23 connecting upper ends of the pair of the first movable frames 21 together, and being configured to be rotated forward and backward to change an angle; a rotatable plate 25 provided horizontally rotatable left and right on an upper surface of the tilting frame 23; and a seating block 27 provided on an upper surface of the rotatable plate 25, with the lithography object S fixed to the seating block.

The first movable frames 21 are vertically provided at opposite sides of a base 20A fixedly provided at the table 11, respectively, and a connecting frame connecting lower ends of the first movable frames 21 together is provided inside the base 20A to be movable in the Y-axis direction, wherein the first movable frames 21 are movable forward and backward by receiving power from a first motor 22 provided beneath the base 20A.

The opposite ends of the tilting frame 23 are hinged to the upper ends of the first movable frames 21, respectively, and the tilting frame reciprocatingly rotates (tilts) forward and backward about the X-axis by receiving power from a second motor 24 provided at one side (right side in the drawing) first movable frame 21, thereby changing the angle.

The rotatable plate 25 is shafted to the upper surface of the tilting frame 23 so as to be horizontally rotatable left and right about the Z-axis, wherein the rotatable plate 25 is rotatable left and right in one direction (or both directions) by receiving power from a third motor 26 provided on the lower surface of tilting frame 23.

The seating block 27 is coupled to the center of the upper surface of the rotatable plate 25, and the substrate B made of a material such as silicon or glass is fixed on the upper surface of the seating block 27 through bonding, taping, or vacuum suction.

Although not shown in the drawings, the rotatable plate 25 and/or the seating block 27 may be further provided with a separate suction means or jig for fixing the substrate B fixed to the seating block 27 and the mask M overlapped with the upper surface of the substrate B together.

The lithography unit 30 includes: a second movable frame 31 provided movable in the left and right horizontal direction along the guide frame 12; and a lithography module 33 configured to be horizontally rotated left and right about a central axis or horizontally revolved left and right about an imaginary axis at a front surface of the second movable frame 31, and provided with a plurality of UV LED lamps for lithography on a lower surface thereof for forming a pattern.

The second movable frame 31 is movable left and right in the X-axis direction, which is a longitudinal direction of the guide frame 12, by receiving power from a fourth motor 32 provided on the back surface of the second movable frame.

The lithography module 33 is provided under a fixed plate 35 fixedly coupled to the front surface of the second movable frame 31, and irradiates ultraviolet light for lithography to the lithography object S fixed to the tilting stage 20 through the plurality of UV LED lamps for lithography provided on the lower surface thereof.

Here, the UV LED lamp irradiates ultraviolet light for lithography of a short wavelength (approximate band of 365 nm to 405 nm), and FIGS. 6A to 6D show an exemplary embodiment in which a total of 400 lamps, width*length 20*20, are arranged.

Figure 6A:
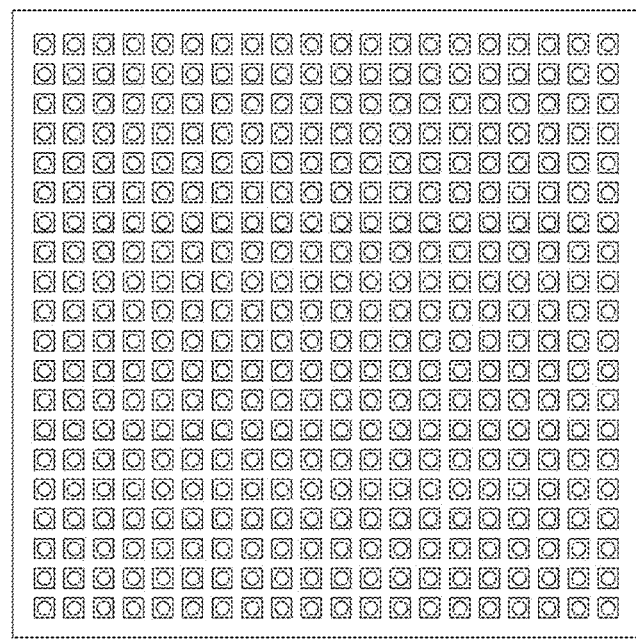
FIGS. 6A to 6D are exemplary views showing arrays of lamps of the lithography unit according to the present invention.
Figure 6B:
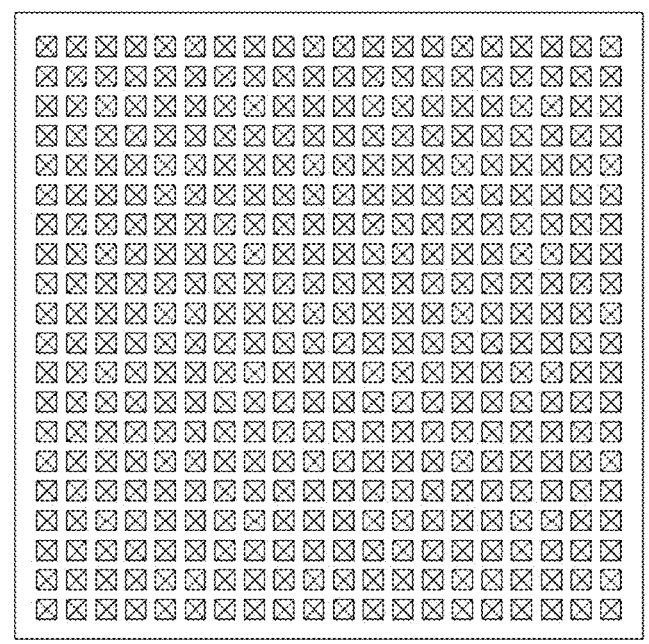
Figure 6C:
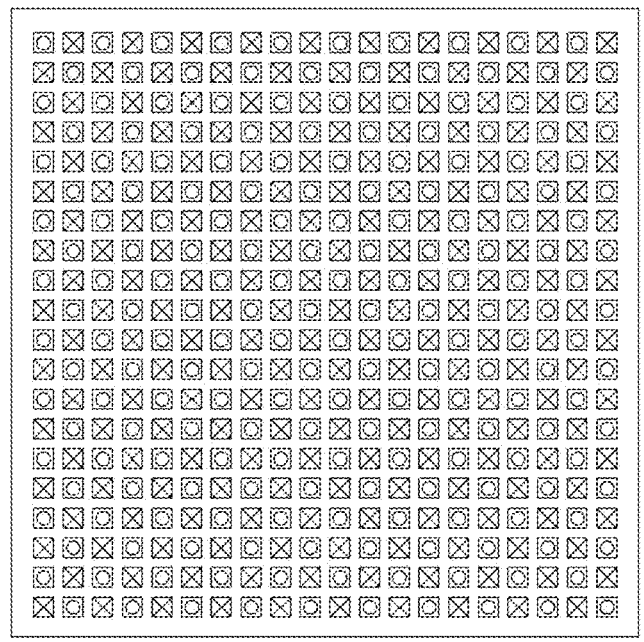
Figure 6D:
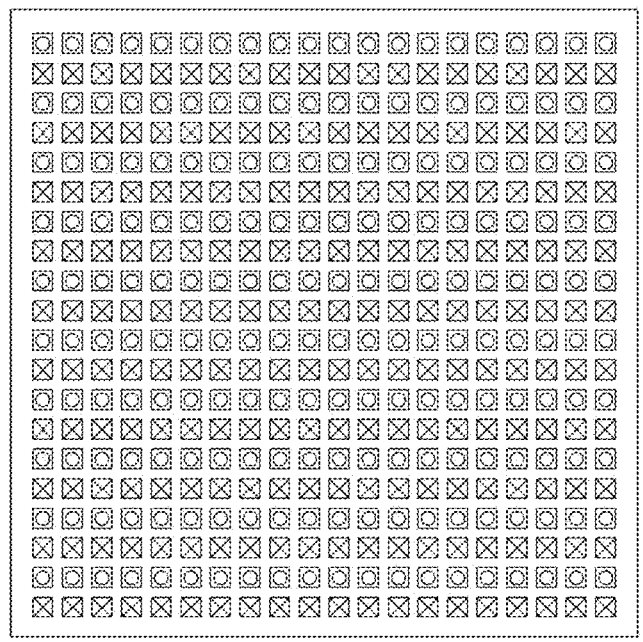

FIG. 6A shows an embodiment in which only the lamps of the 405 nm band (hereinafter, referred to as first lamps) are provided, FIG. 6B shows an embodiment in which only the lamps of the 365 nm band (hereinafter, referred to as second lamps) are provided, FIG. 6C shows an embodiment in which the first lamps and the second lamps are alternately arranged in a zigzag shape, and FIG. 6D shows an embodiment in which the first lamps (or the second lamps) are arranged in a row in the nth column and the second lamps (or the first lamps) are arranged in a row in the n+1th column, such that different lamps are arranged in an alternate manner for each column.

However, the type, number, arrangement type, etc. of these lamps are not limited to the present specification, but may be changed according to the specifications of the lithography object S.

In the drawings, reference numeral 33a denotes a projection lens that protects each lamp, and a predetermined number of projection lenses are modularized to adjust the number of lamps provided in the lithography unit 30 according to the size of the lithography object S, and the like.

Further, reference numeral 33b denotes a heat sink for dissipating heat generated from lamps to the outside.

Meanwhile, the lithography module 33 is rotated or revolved in one direction by receiving power from a fifth motor 34 provided on the front surface of the second movable frame 31.

Firstly, although not shown in the drawings, the lithography module 33 is shafted to the center of the fixed plate 35 through a rotating shaft, and the fifth motor 34 and the rotating shaft are connected to each other by a gear bundle or a belt structure so that the lithography module is rotated in one direction about the rotating shaft, which is the central axis of the lithography module 33.

Figure 4:
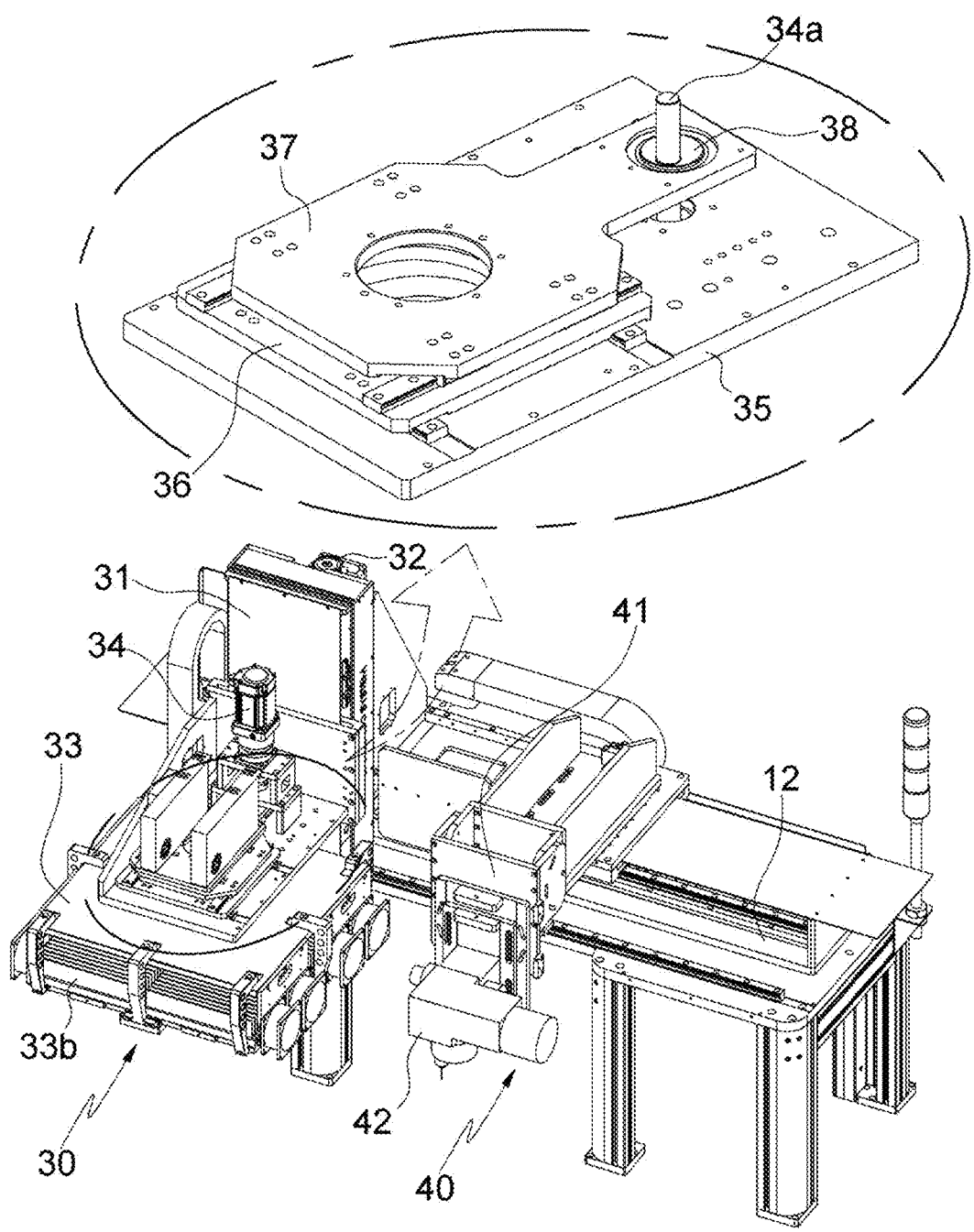
FIG. 4 is a perspective view a lithography unit and an alignment unit according to the present invention.

Next, the revolving operation of the lithography module 33 will be described with reference to a perspective view in the circle of FIG. 4.

To be specific, the lithography unit 30 includes: a first movable plate 36 coupled to the upper surface of the fixed plate 35 to be reciprocatingly movable in the left and right horizontal direction; and a second movable plate 37 coupled to the upper surface of the first movable plate 36 to be reciprocatingly movable in the horizontal forward and backward direction.

The lithography module 33 is connected to the first movable plate 36 through a fixed shaft from a position under the fixed plate 35 to be movable along with the first movable plate 36.

The second movable plate 37 is provided at a rear end thereof with an eccentric cam 38 coupled at a position off-center of a drive shaft 34a of the fifth motor 34.

Thus, the rotation of the fixed drive shaft 34a while the fifth motor 34 is operating causes the eccentric cam 38 to rotate by revolving around the drive shaft 34a.

The rotation of the eccentric cam 38 causes the second movable plate 37 to reciprocate in the Y-axis direction while simultaneously causing the first movable plate 36 to reciprocate in the X-axis direction.

The combination of the repetitive reciprocating movement of the first and second movable plates 36 and 37 allows the lithography module 33 connected to the first movable plate 36 to revolve by rotating in one direction about the imaginary axis which is the circular motion center of the fixed axis.

Referring again to FIGS. 1A to 5E, the alignment unit 40 includes: a third movable frame 41 connected to a side of the second movable frame 31 to be moved along the guide frame 12 in the left and right horizontal direction along with the second movable frame 31; and a microscope 42 coupled to a front surface of the third movable frame 41, and used to visually check whether the mask M laminated on the substrate B is aligned.

The third movable frame 41 is connected to the second movable frame 31 so as to be movable in the X-axis direction along with the second movable frame 31 by receiving power from the fourth motor 32.

The microscope 42 has an eyepiece portion (not shown) provided on the upper portion thereof and a lens portion provided on the lower portion thereof to enlarge the upper surfaces of the substrate B and the mask M placed on the seating block 27 so that a worker can visually recognize them.

The mask loading unit 50 includes: a movable plate 51 provided movable forward and backward under the tilting frame 23; a first movable block 52 provided positionally adjustable left and right with respect to the movable plate 51; a second movable block 54 provided positionally adjustable forward and backward with respect to the first movable block 52; a vertically movable block 56 provided adjustable in height with respect to the second movable block 54; and a loading frame 58 extending from the vertically movable block 56 to a position above the rotatable plate by bypassing the rotatable plate 25 and having a detachable portion 58a allowing the mask M to be seated thereon.

The movable plate 51 is coupled to the upper surface of the base 20A to be slidable forward and backward, and thus the movable plate 51 can be moved by the worker pulling or pushing the movable plate 51 in the Y-axis direction with a handle 51a. Further, a fixed block 51b is fixedly coupled to the center of the upper surface of the movable plate 51.

The first movable block 52 is slidably coupled to the upper surface of the fixed block 51b to be movable left and right, and is connected to a first fine adjusting rod 53 provided on the front surface of the fixed block 51b. Thus, when the first fine adjusting rod 53 is rotated bidirectionally, the first movable block 52 is moved in the X-axis direction and thus a left and right position thereof is adjusted by a rod portion in and out from the first fine adjusting rod 53.

The second movable block 54 is slidably coupled to the upper surface of the first movable block 52 to be movable forward and backward, and is connected to a second fine adjusting rod 55 provided on the second side surface of the first movable block 52. Thus, when the second fine adjusting rod 55 is rotated bidirectionally, the second movable block 54 is moved in the Y-axis direction and thus a forward and backward position thereof is adjusted by a rod portion in and out from the second fine adjusting rod 55.

The vertically movable block 56 is slidably coupled to the front and back surfaces of the second movable block 54 to be movable up and down, and is connected to a third fine adjusting rod 57 provided through the sides of the second movable block 54 by a gear bundle structure or the like (for example, a rack gear, and so on). Thus, when the third fine adjusting rod 57 is rotated bidirectionally, the vertically movable block 56 is moved up and down in the Z-axis direction and thus a height thereof is adjusted.

The loading frame 58 is connected to the rear end side of the vertically movable block 56 in a 'C' shape so as to bypass the rotatable plate 25, and is provided at the upper end thereof with the detachable portion 58a formed in a 'C' shape with a front end thereof being open. Thus, the detachable portion 58a is disposed at the position above the rotatable plate 25, and the mask M can be slidably inserted in the detachable portion 58a.

The control means individually controls UV LED lamps of the lithography unit 30 so as to enable individual control for each lamp by combining at least one of light-on or light-off of each lamp, color of each lamp, and brightness of each lamp.

Although a desktop PC 13 provided at one side of the front end of the table 11 as the control means is exemplarily shown in the drawings, various electronic input devices such as a notebook PC, a tablet PC, a central control room, and a separate controller may be used.

In addition, the control means is electrically connected with the alignment unit 40 and/or the mask loading unit 50 so as to control the operation of the alignment unit 40 and/or the mask loading unit 50 through the control means.

In other words, the control means may allow the enlarged image inputted through the microscope 42 to be output to a display portion of the control means (for example, a monitor of the PC 13).

Further, the individual operation of each part of the movable plate 51, the first movable block 52, the second movable block 54, the vertically movable block 56, and the loading frame 58 is remotely controlled by an input unit of the control means (for example, a mouse or a keyboard of the PC 13).

Here, for remote control of the mask loading unit 50 through the control means, a driving means such as a motor, which enables individual operation of each configuration of the mask loading unit 40, may be provided, which simply replaces the configuration required for the above described manual operation with a motor or the like.

To achieve this, a driving means such as a motor for remote control of the movable plate 51, the first movable block 52, the second movable block 54, the vertically movable block 56, and the loading frame 58 is further provided, and the detailed description of the individual operation of each configuration using the motor is omitted because it can be sufficiently reproduced on the basis of the manual control described above by those skilled in the art.

Hereinafter, the operation of the 3D micro lithography-printing system using tilting and rotational UV-LEDs configured as described above will be described in detail.

Figure 5A:
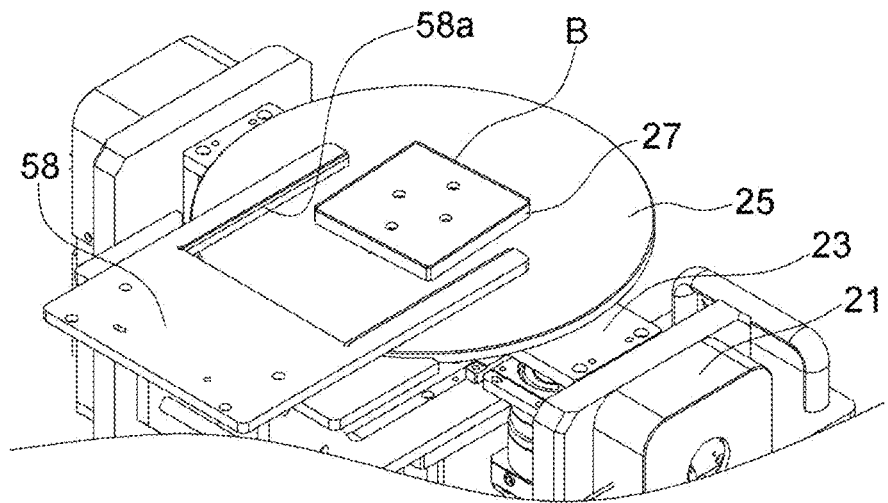
FIGS. 5A to 5E are perspective views showing of important portions of operation steps of the present invention.

Firstly, as shown in FIG. 5A, the worker fixes the substrate B on the upper surface of the seating block 27 of the rotatable plate 25. Here, the substrate B may be fixed through bonding, taping, or vacuum suction, or may be fixed by a separate jig, and here, the PR solution is applied to the substrate B in advance.

Figure 5B:
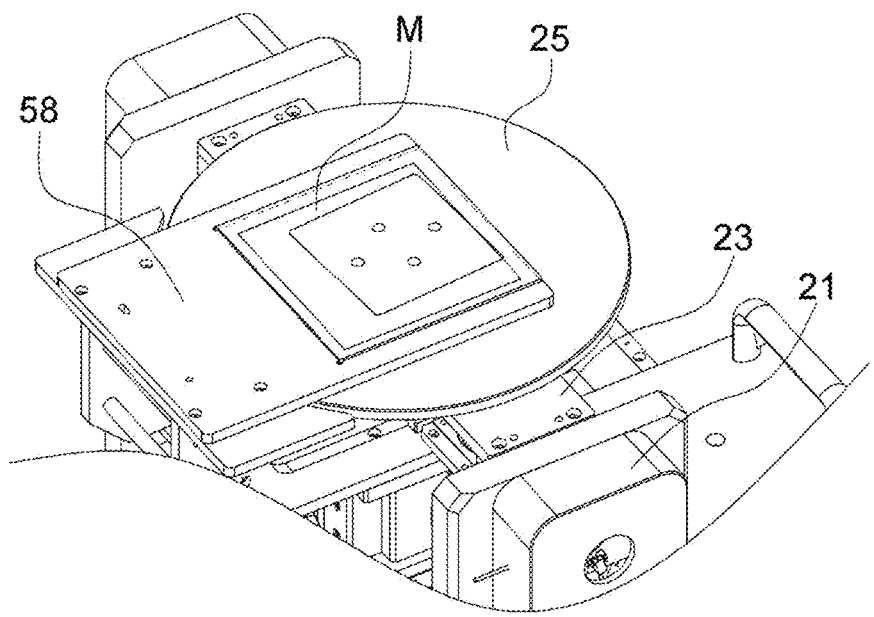

When the fixing of the substrate B is completed, as shown in FIG. 5B, after the mask M is mounted on the detachable portion 58a of the mask loading unit 50, the mask loading unit 50 is moved forward by using the handle 51a of the movable plate 51 so that the mask M on the detachable portion 58a is positioned at a position above the substrate B of the seating block 27.

Figure 5C:
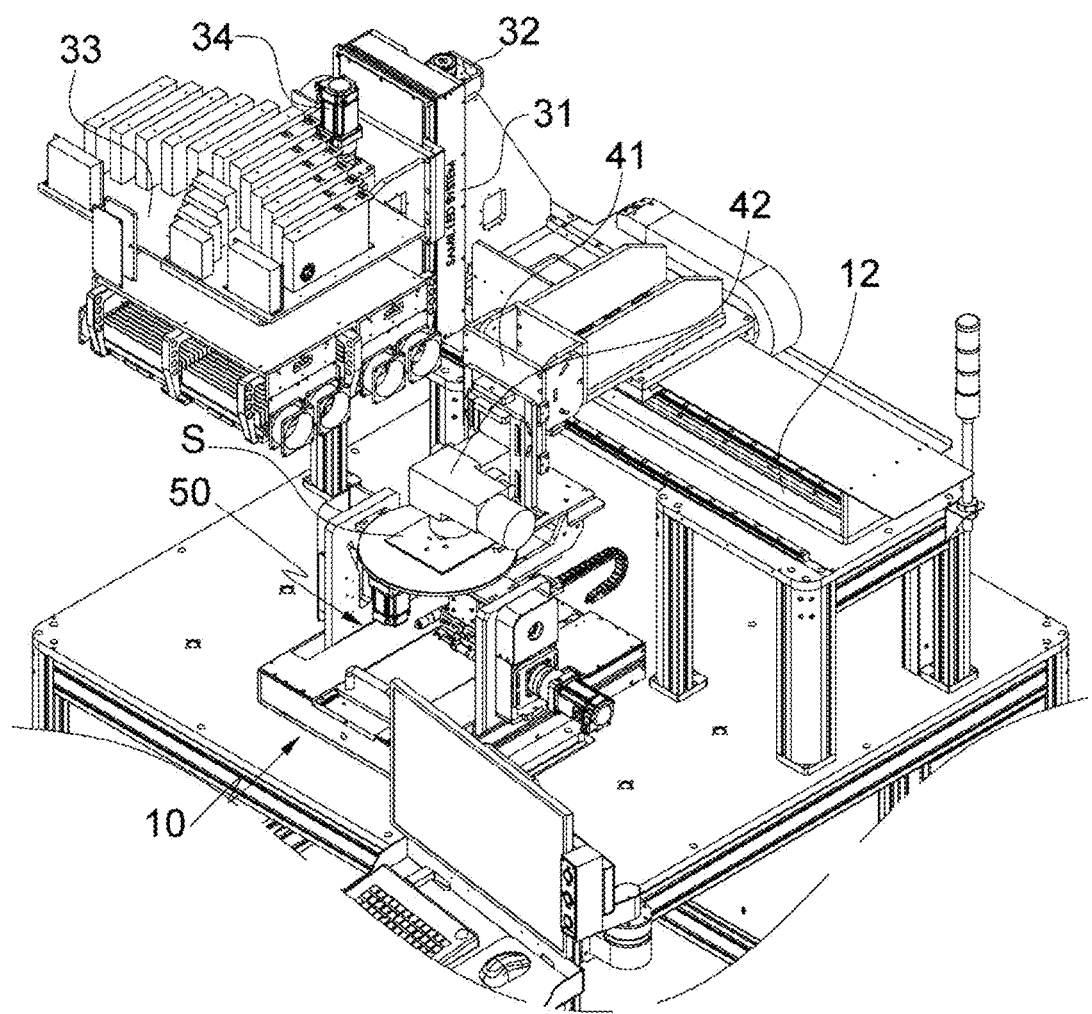
Figure 5D:
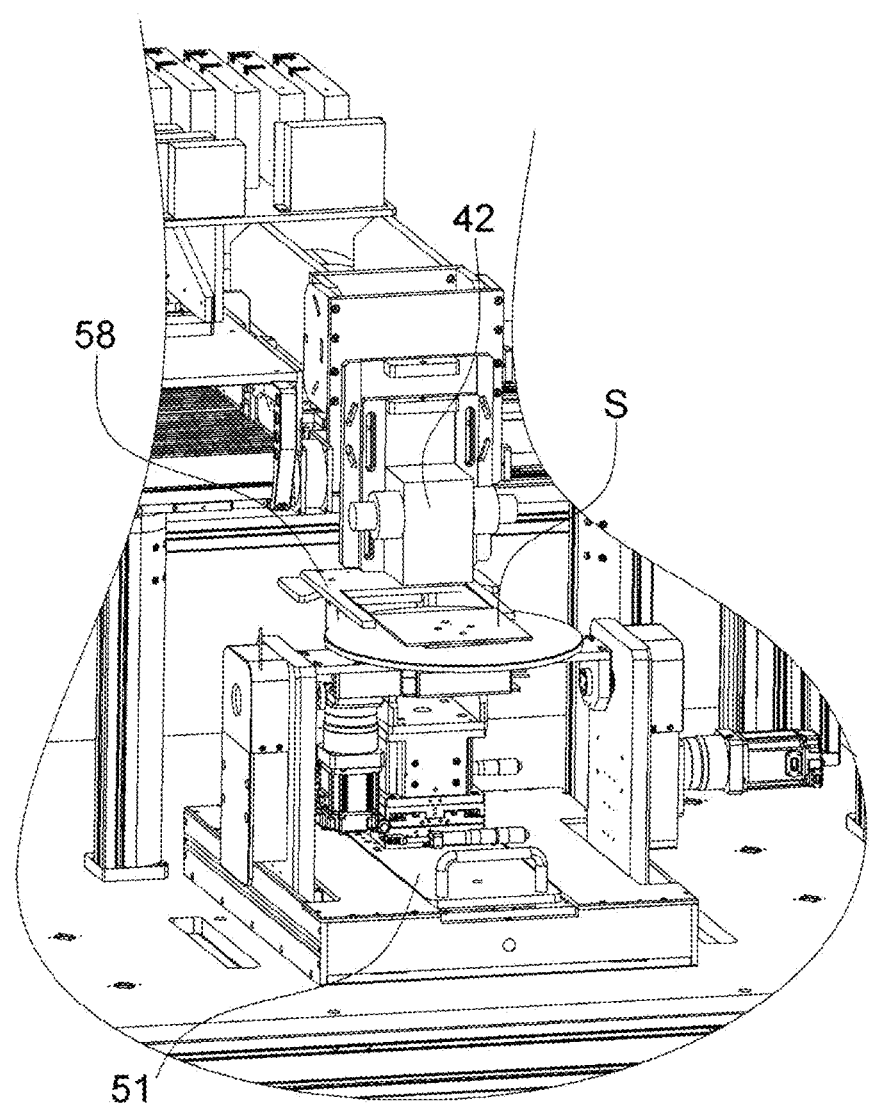

Further, as shown in FIGS. 5C and 5D, after the alignment unit 40 is moved to a position above the tilting stage 20, the worker adjusts the forward, backward, left, and right positions of the mask M by using the first and second fine adjusting rods 53 and 55 of the mask loading unit 50 while checking the alignment position of the substrate B and the mask M in the vertical direction (for example, visually checking whether the markings printed on the substrate B and the mask M are aligned) by using the microscope 42, and then, when the substrate B and the mask M are aligned in a row, the mask M is moved down by using the third fine adjusting rod 57 to be seated on the substrate B, and the substrate B and the mask M are fixed with a jig or the like.

After the alignment of the substrate B and the mask M is completed, the mask loading unit 50 is pushed back by using the handle 51a, so that the loading frame 58 is separated from the tilting stage 20.

Of course, as described above, the alignment of the mask M and the operation of the mask loading unit 50 may be performed remotely through the control means.

Here, according to the present invention, after completion of lithography process for one mask M, only the completed mask M is removed, and another mask M is accurately aligned on the working substrate B by using the alignment mask 40 and the mask loading unit 50, which enables continuous work, and accordingly, the forming of a high-aspect ratio pillar or 3D pattern through multi-layer lithography is possible.

After the alignment of the substrate B and the mask M is completed, the worker sets the individual operation of the lamps through the control means and starts the lithography process.

Figure 5E:
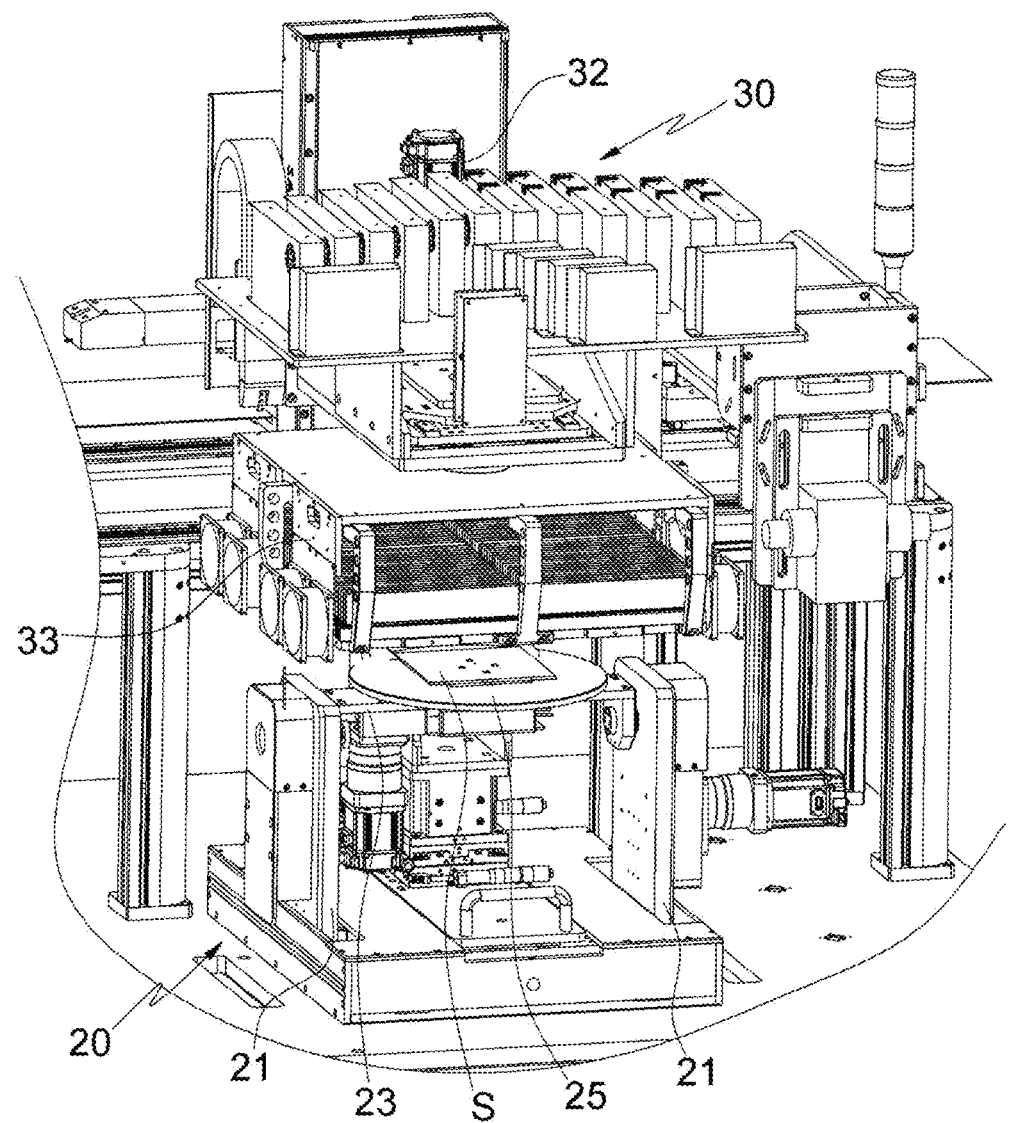

When the lithography process starts, as shown in FIG. 5E, after the lithography unit 30 is moved to a position above the tilting stage 20, the first to third motors 22, 24, and 26 of the tilting stage 20, and the fifth motor 34 of the lithography unit 30 are operated.

Then, the lithography object S fixed to the seating block 27 is subject to forward and backward reciprocating movement of the first movable frames 21, angle change (tilting) by forward and backward reciprocating rotation of the tilting frame 23, and continuous rotation of the rotatable plate 25, simultaneously, so the direction in which the light beam is irradiated is continuously changed according to the set pattern.

At the same time, the irradiation direction of the light from the lamps is continuously changed by the rotation or revolution of the lithography module 33, so that each lamp is operated individually (lighting, color change, brightness control) according to the set pattern.

Accordingly, by varying the direction of the light incident on the lithography object S three-dimensionally, it is possible to three-dimensionally form a high-aspect ratio pillar or a multi-layer micro-pattern into various shapes.

Figure 7A:
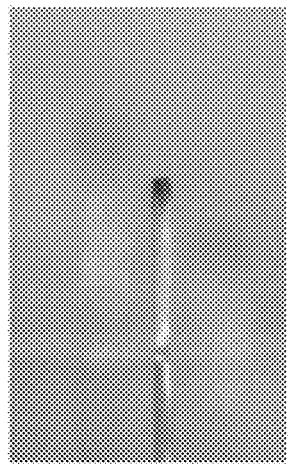
FIGS. 7A to 7F are enlarged photographs imaged by a microscope of pillars and 3D patterns formed by the present invention.
Figure 7B:
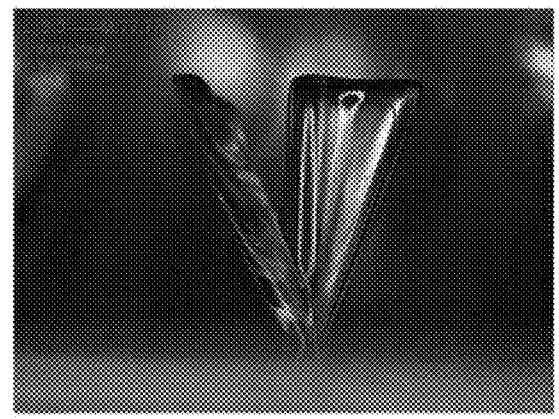
Figure 7C:
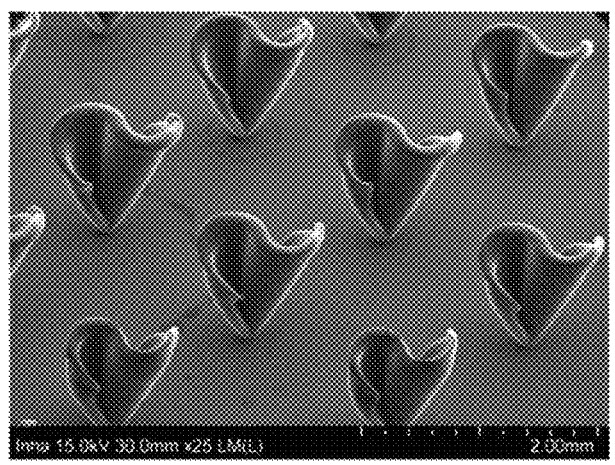
Figure 7D:
Figure 7E:
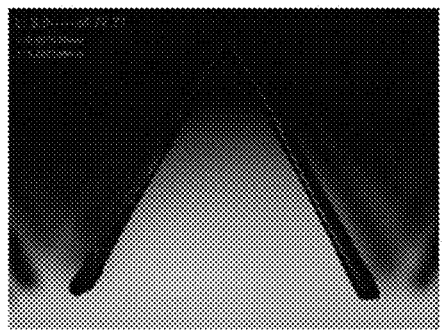
Figure 7F:
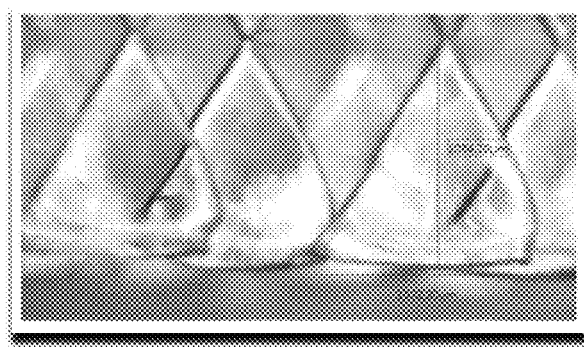

FIGS. 7A to 7F are enlarged photographs of pillars and 3D patterns realized through the present invention, wherein FIG. 7A shows a pillar having an aspect ratio of 6:1 or more, FIGS. 7B and 7C show S-shaped 3D micro-patterns, FIG. 7D shows conical spiral shaped 3D micro-patterns, FIG. 7E shows V-shaped 3D micro-patterns, and FIG. 7F shows corn-type 3D micro-patterns.

These pillars and micro-patterns may be implemented in an oblique shape with a standard of about 30 to 50 μm, and it is possible to precisely form the micro-pattern of the printed circuit board B, which cannot be realized by the conventional lithography apparatus, and micro-forming within a range of approximately 5 μm is also possible.

In particular, the present invention is advantageous in that the operations of the tilting stage 20 and the operation of the lithography unit 30 are set in various combinations, and simultaneously, the mask M is repetitively laminated, and thus, the shape of the pattern can be variously formed in 3D shape.

Although the 3D micro lithography-printing system using tilting and rotational UV-LEDs has been described with reference to the accompanying drawings for illustrative purposes, those skilled in the art will appreciate that various modifications, additions and substitutions are possible, without departing from the scope and spirit of the invention as disclosed in the accompanying claims.

What is claimed is:

1. A 3D micro lithography-printing system using tilting and rotational UV-LEDs, in which the lithography-printing system forms a pattern by irradiating ultraviolet light for lithography to a lithography object with a mask being laminated on a substrate, the lithography-printing system comprising:
 a main body including: a table; and a guide frame provided in a left and right horizontal direction at an upper portion of the table;
 a tilting stage including: a pair of first movable frames provided movable forward and backward on the table; a tilting frame connecting upper ends of the pair of first movable frames together, and being configured to be rotated forward and backward to change an angle; a rotatable plate provided horizontally rotatable left and right on an upper surface of the tilting frame; and a seating block provided on an upper surface of the rotatable plate, with the lithography object fixed to the seating block;

a lithography unit including: a second movable frame provided movable in the left and right horizontal direction along the guide frame; and a lithography module configured to be horizontally rotated left and right about a central axis or horizontally revolved left and right about an imaginary axis at a front surface of the second movable frame, and provided with a plurality of UV LED lamps for lithography on a lower surface thereof for forming a pattern; and an alignment unit including: a third movable frame connected to a side of the second movable frame to be moved along the guide frame in the left and right horizontal direction along with the second movable frame; and a microscope coupled to a front surface of the third movable frame, and used to visually check whether the mask laminated on the substrate is aligned.

2. The lithography-printing system of claim 1, further comprising:

a mask loading unit including: a movable plate provided movable forward and backward under the tilting frame; a first movable block provided positionally adjustable left and right with respect to the movable plate; a second movable block provided positionally adjustable forward and backward with respect to the first movable block; a vertically movable block provided adjustable in height with respect to the second movable block; and a loading frame extending from the vertically movable block to a position above the rotatable plate by bypassing the rotatable plate and having a detachable portion allowing the mask to be seated thereon.

3. The lithography-printing system of claim 1, further comprising:

a control means that individually controls the plurality of UV LED lamps for lithography to enable individual control for each of the lamps by combining at least one of light-on or light-off of each lamp, color of each lamp, and brightness of each lamp.

* * * * *